(12) United States Patent
Tsai et al.

(10) Patent No.: US 7,649,399 B2
(45) Date of Patent: Jan. 19, 2010

(54) SIGNAL GENERATING AND SWITCHING APPARATUS AND METHOD THEREOF

(75) Inventors: Chang-Tien Tsai, Hsinchu County (TW); Cheng-Chung Shih, Taipei County (TW); Shih-Pin Hsu, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 197 days.

(21) Appl. No.: 11/752,304

(22) Filed: May 23, 2007

(65) Prior Publication Data

US 2008/0054985 A1    Mar. 6, 2008

(30) Foreign Application Priority Data

Aug. 31, 2006    (TW) .............................. 95132149 A (51) Int. Cl.
*G06F 13/00*    (2006.01)
*H03K 17/00*    (2006.01)

(52) U.S. Cl. ..................... 327/365; 327/427; 326/41

(58) Field of Classification Search ................. 327/365, 327/373, 403–404, 391, 427, 419; 326/41, 326/101

See application file for complete search history.

(56) References Cited

U.S. PATENT DOCUMENTS

| 5,757,225 A * | 5/1998 | Tobita ........................ 327/539 |
| 6,525,563 B2 * | 2/2003 | Hamano et al. ................ 326/41 |

\* cited by examiner

*Primary Examiner*—Dinh T. Le
(74) *Attorney, Agent, or Firm*—Jianq Chyun IP Office (57) ABSTRACT

A signal generating and switching apparatus and a method thereof are provided. According to a simple layout technique, the signal switching apparatus is formed in each layer of a plurality of metal layers in an integrated circuit. When there is a need to correct any one of the plurality of conductive layers in the integrated circuit, the changing of the signal switching apparatus in that conductive layer can be achieved by changing mask patterns of the conductive layer. As a result, the transmission path of signals in the conductive layer is changed, and the purpose to change output logic signals is achieved. Therefore, there is no need to change additional conductive layers, thereby significantly reducing the correcting cost of the integrated circuit.

18 Claims, 6 Drawing Sheets

SIGNAL GENERATING AND SWITCHING APPARATUS AND METHOD THEREOF

CROSS-REFERENCE TO RELATED APPLICATION

This application claims the priority benefit of Taiwan application serial no. 95132149, filed Aug. 31, 2006. All disclosure of the Taiwan application is incorporated herein by reference.

BACKGROUND OF THE INVENTION

1. Field of Invention

The present invention relates to a signal generating and switching apparatus in an integrated circuit and a method thereof. More particularly, the present invention relates to a signal generating and switching apparatus in an integrated circuit capable of changing a metal layer many times and a method thereof.

2. Description of Related Art

Figure 1:
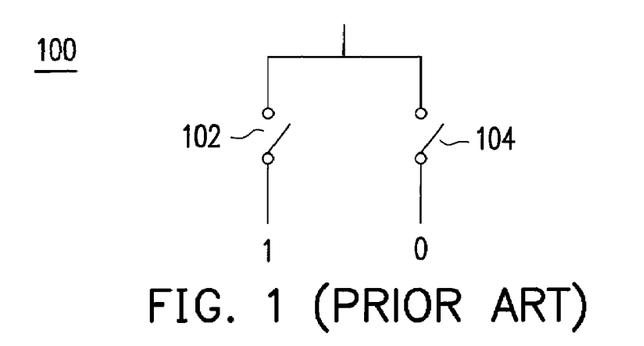
FIG. 1 is a principle diagram of the signal switching apparatus in a metal layer of an integrated circuit according to the prior art.

Generally speaking, common electronic circuits require a circuit capable of providing signals of a specific logic value, for example, the circuit for recording version information in an integrated circuit. FIG. 1 is a principle diagram of a signal generating apparatus 100 in a metal layer of an integrated circuit according to the prior art. FIG. 1 shows a signal generating apparatus for one bit of the version information as an example to illustrate the signal switching principle of the prior art. As shown in FIG. 1, the signal generating apparatus 100 of the prior art comprises a switch 102 and a switch 104.

The integrated circuit comprises a plurality of conductive layers including metal layers and polysilicon layers. In the conventional layout technique for the integrated circuit, a top metal layer is usually used to record the version information of the integrated circuit. That is, the switches 102 and 104 of the signal generating apparatus 100 are disposed on the top metal layer. A logic high level "1" is input from the first end of the switch 102 and the logic low level "0" is input from the first end of the switch 104. When the bit information is changed, the switches 102 and 104 can be turned on or off to output a specific logic signal.

Therefore, if there is a need to change the circuit of one of the plurality of conductive layers in the integrated circuit, although the change of the circuit on the top metal layer is not desired, the top metal layer will still be changed at the same time in order to update the version information. In other words, not only the mask for the internal conductive layer of a circuit is to be changed, but also the mask for the top metal layer must be re-fabricated, so as to update the version information, thus significantly increasing the correcting cost of the integrated circuit.

SUMMARY OF THE INVENTION

Accordingly, the present invention is directed to provide a signal generating apparatus capable of changing each signal switching apparatus independently so as to change an output signal.

The present invention is also directed to provide a signal switching apparatus capable of providing infinite changes.

The present invention is further directed to provide a signal switching method. When one layer in an integrated circuit is corrected, the output version information can be changed at the same time without changing other layers, thereby significantly reducing the correcting cost of the integrated circuit.

According to an aspect of the present invention, the signal generating apparatus comprises a first logic generating device, a second logic generating device, and a first signal switching apparatus. The first logic generating device is used to output a signal of a first logic value. The second logic generating device is used to generate a signal of a second logic value. The first signal switching apparatus comprises a first input end, a second input end, a first output end, and a second output end. The first input end and the second input end of the first signal switching apparatus are coupled to the first logic generating device and the second logic generating device respectively, such that the signals input from the first input end and the second input end of the first signal switching apparatus can be output from the first output end and the second output end of the first signal switching apparatus respectively, or the signals input from the first input end and the second input end of the first signal switching apparatus can be output from the second output end and the first output end of the first signal switching apparatus respectively.

According to an aspect of the present invention, the signal switching apparatus is used to switch the passing signal many times, and has a first input end, a second input end, a first output end, and a second output end. The signal switching apparatus comprises a first switch, a second switch, a third switch, and a fourth switch. The first switch is coupled between the first input end and the first output end of the signal switching apparatus. When the first switch is turned on, the signal input from the first input end of the signal switching apparatus is output from the first output end. The second switch is coupled between the second input end and the second output end of the signal switching apparatus. When the second switch is turned on, the signal input from the second input end of the signal switching apparatus is output from the second output end. The third switch is coupled between the first input end and the second output end of the signal switching apparatus. When the third switch is turned on, the signal input from the first input end of the signal switching apparatus is output from the second output end. The fourth switch is coupled between the second input end and the first output end of the signal switching apparatus. When the fourth switch is turned on, the signal input from the second input end of the signal switching apparatus is output from the first output end.

According to an aspect of the present invention, the signal switching method provided is used to switch the passing signal many times, which comprises: providing two transmission paths for a first input signal and a second input signal respectively; and in the transmission path of the first input signal and the transmission path of the second input signal, changing the transmission paths of the first input signal and the second input signal by plural-group means, thereby changing the final output signal.

The present invention uses a simple layout technique to make each of the plurality of conductive layers have a signal switching apparatus. Therefore, when there is a need to correct any one of the plurality of layers in the integrated circuit, the signal switching apparatus in the metal layer can be used to achieve the correction without changing the top metal layer, thereby significantly reducing the correcting cost of the integrated circuit.

In order to make the aforementioned and other objects, features and advantages of the present invention comprehensible, preferred embodiments accompanied with figures are described in detail below.

DESCRIPTION OF EMBODIMENTS

Generally speaking, common electronic circuits require a circuit capable of providing signals of a specific logic value, for example, the circuit for recording version information in an integrated circuit. In the following embodiments, the circuit for recording the version information in the integrated circuit is taken as an application example. For the convenience of illustration, a signal generating apparatus for one bit of the version information is taken as an example.

Figure 7:
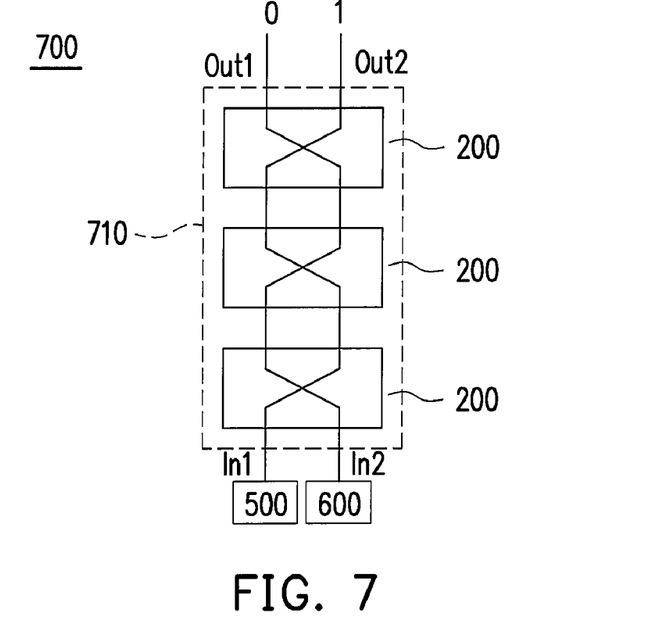
FIG. 7 is a simplified logic diagram of the signal generating apparatus in the integrated circuit according to an embodiment of the present invention.

FIG. 7 is a simplified logic diagram of the signal generating apparatus 700 in the integrated circuit according to an embodiment of the present invention. As shown in FIG. 7, the signal generating apparatus 700 includes a first logic generating device 500, a second logic generating device 600, and a plurality of signal switching apparatuses 200. The first logic generating device 500 is used to generate a logic high level, and the second generating device 600 is used to generate a logic low level. The plurality of signal switching apparatuses 200 is coupled in series to form a multilevel signal switching apparatus 710, wherein the multilevel signal switching apparatus 710 includes a first input end In1, a second input end In2, a first output end Out1, and a second output end Out2. The first input end In1 and the second input end In2 of the multilevel signal switching apparatus 710 are coupled to the first logic generating device 500 and the second logic generating device 600 respectively. Therefore, the logic signal passing through can be switched through changing the switches in individual signal switching apparatuses 200, such that the signals output from the first output end Out1 and the second output end Out2 of the multilevel signal switching apparatus 710 can be switched between a logic high level and a logic low level. Each signal switching apparatus 200 can be disposed in each conductive layer (including the metal layer, polysilicon layer, via plug layer, contact layer, active layer, etc.) in the integrated circuit. As shown in the figure, the changing of any one of the signal switching apparatuses 200 may cause the variation of the logic level output by the signal generating device 700. Therefore, when the signal generating device 700 is applied to the conductive layers in the integrated circuit, only the individual signal switching apparatus 200 needs to be changed to achieve the purpose of changing individual conductive layers.

Figure 2:
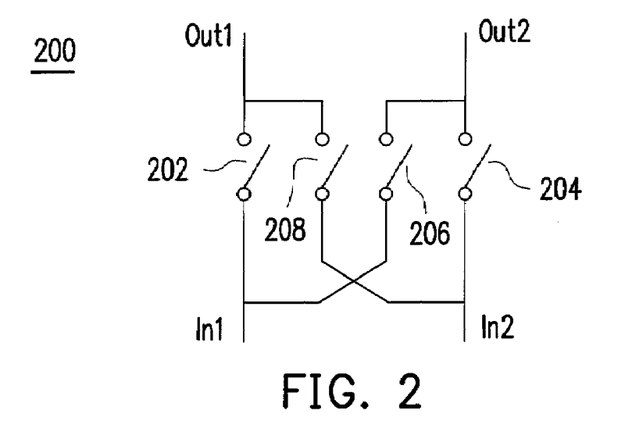
FIG. 2 is a principle diagram of the signal switching apparatus in a metal layer of an integrated circuit according to an embodiment of the present invention.

Referring to FIGS. 2-6, the principle and function of each device in FIG. 7 will be illustrated below. FIG. 2 is a circuit diagram of the signal switching apparatus 200 disposed in the conductive layer (including the metal layer, polysilicon layer, via plug layer, contact layer, active layer, etc) in the integrated circuit according to an embodiment of the present invention. As shown in FIG. 2, the signal switching apparatus 200 includes a first input end In1, a second input end In2, a first output end Out1, and a second output end Out2. The first input end In1 and the second input end In2 are used to receive an input logic signal, and the first output end Out1 and the second output end Out2 are used to output a switched logic signal. The signal switching apparatus 200 includes a first switch 202, a second switch 204, a third switch 206 and a fourth switch 208. The first switch 202 is coupled between the first input end In1 and the first output end Out1 of the signal switching apparatus 200. When the first switch 202 is turned on, the signal input from the first input end In1 of the signal switching apparatus 200 is output from the first output end Out1. The second switch 204 is coupled between the second input end In2 and the second output end Out2 of the signal switching apparatus 200. When the second switch 204 is turned on, the signal input from the second input end In2 of the signal switching apparatus 200 is output from the second output end Out2. The third switch 206 is coupled between the first input end In1 and the second output end Out2 of the signal switching apparatus 200. When the third switch 206 is turned on, the signal input from the first input end In1 of the signal switching apparatus 200 is output from the second output end Out2. The fourth switch 208 is coupled between the second input end In2 and the first output end Out1 of the signal switching apparatus 200. When the fourth switch 208 is turned on, the signal input from the second input end In2 of the signal switching apparatus is output from the first output end Out1. Here, it should be noted that the first switch 202 and the second switch 204 are simultaneously turned on or off, and the third switch 206 and the fourth switch 208 are simultaneously turned on or off. Furthermore, when the first switch 202 and the second switch 204 are turned on, the third switch 206 and the fourth switch 208 are turned off. When the first switch 202 and the second switch 204 are turned off, the third switch 206 and the fourth switch 208 are turned on.

For the conductive layer of the integrated circuit, the signal switching apparatus 200 can be realized by patterning the conductive layer with a corresponding mask. Through changing the pattern of the mask of the conductive layer, each switch in the signal switching apparatus 200 can be turned on and off, thereby changing the output signal. The implementation of the signal switching apparatus 200 will be described in detail in the following embodiment and will not be illustrated herein again.

Figure 3:
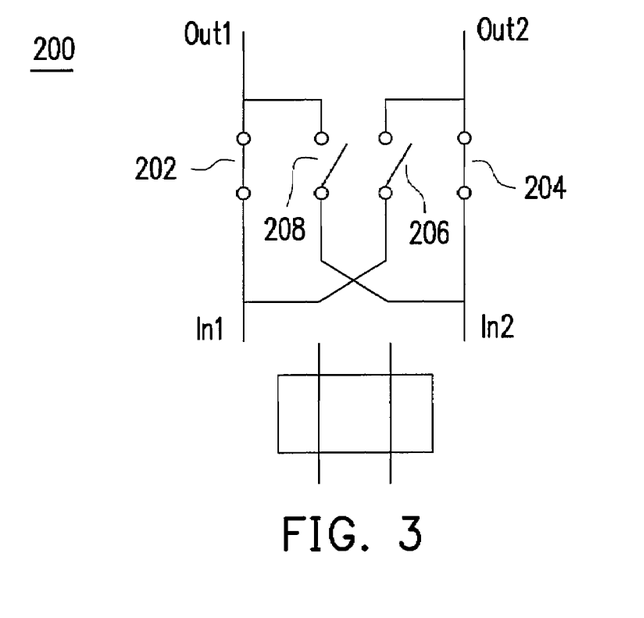
FIG. 3 is a principle diagram and a simplified logic diagram of the signal switching apparatus in a non-switching state in the metal layer of the integrated circuit according to an embodiment of the present invention.

FIG. 3 is a principle diagram and a simplified logic diagram of the signal switching apparatus 200 in a non-switching state in the conductive layer of the integrated circuit according to an embodiment of the present invention. As shown in FIG. 3, the first switch 202 and the second switch 204 of the signal switching apparatus 200 are turned on, and the third switch 206 and the fourth switch 208 are turned off. Therefore, the signal input from the first input end In1 of the signal switching apparatus 200 is output from the first output end Out1, and the signal input from the second input end In2 of the signal switching apparatus 200 is output from the second output end Out2. The simplified logic of the non-switching state is indicated by the transmission path of the passing signal as shown in the figure.

Figure 4:
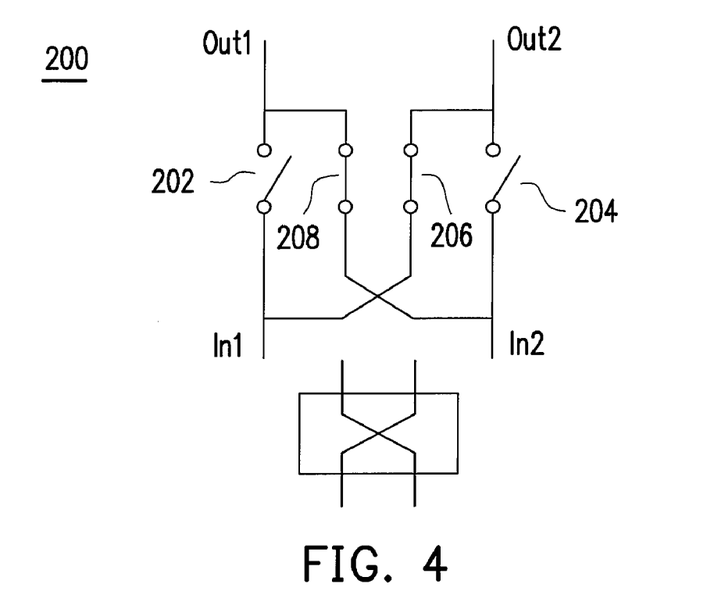
FIG. 4 is a principle diagram and a simplified logic diagram of the signal switching apparatus in a switching state in the metal layer of the integrated circuit according to an embodiment of the present invention.

FIG. 4 is a principle diagram and a simplified logic diagram of the signal switching apparatus 200 in a switching state in the conductive layer of the integrated circuit according to an embodiment of the present invention. As shown in FIG. 4, the first switch 202 and the second switch 204 of the signal switching apparatus 200 are turned off, and the third switch 206 and the fourth switch 208 are turned on. Therefore, the signal input from the first input end In1 of the signal switching apparatus 200 is output from the second output end Out1, and the signal input from the second input end In2 of the signal switching apparatus 200 is output from the first output end Out1. The simplified logic of the switching state is indicated by the transmission path of the passing signal as shown in the figure.

Figure 5:
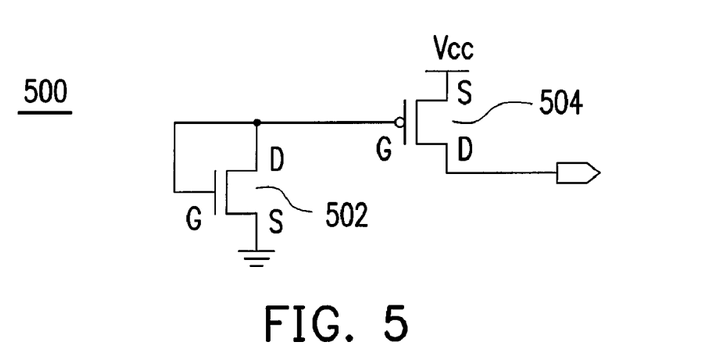
FIG. 5 is a circuit diagram of the first logic generating device for generating a logic high level in the integrated circuit according to an embodiment of the present invention.

FIG. 5 is a circuit diagram of the first logic generating device 500 in FIG. 7 for generating a logic high level according to an embodiment of the present invention. As shown in FIG. 5, the first logic generating device 500 includes an N-type transistor 502 and a P-type transistor 504. The N-type transistor 502 has a gate coupled to the drain, and a source connected to ground. The P-type transistor 504 has a gate coupled to the drain of the N-type transistor 502, and a source receiving a logic high level voltage Vcc. It can be seen from the connection relation of the circuit that the drain of the P-type transistor 504 outputs a logic high level. This circuit can prevent electrostatic discharge (ESD) damage of the power source voltage.

Figure 6:
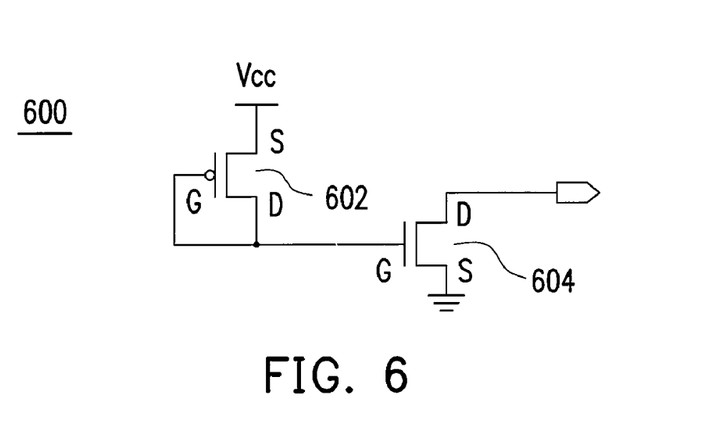
FIG. 6 is a circuit diagram of the second logic generating device for generating a logic low level in the integrated circuit according to an embodiment of the present invention.

FIG. 6 is a circuit diagram of the second logic generating device 600 for generating a logic low level in the integrated circuit according to an embodiment of the present invention. As shown in FIG. 6, the second logic generating device 600 includes a P-type transistor 602 and an N-type transistor 604. The P-type transistor 602 has a gate coupled to a drain, and a source receiving a logic high level voltage Vcc. The N-type transistor 604 has a gate coupled to the drain of the P-type transistor 602, and a source connected to ground. It can be seen from the connection relation of the circuit that the drain of the N-type transistor 604 outputs a logic low level. Similar to the circuit in FIG. 5, this circuit can prevent electrostatic discharge (ESD) damage of the power source voltage.

Figure 8:
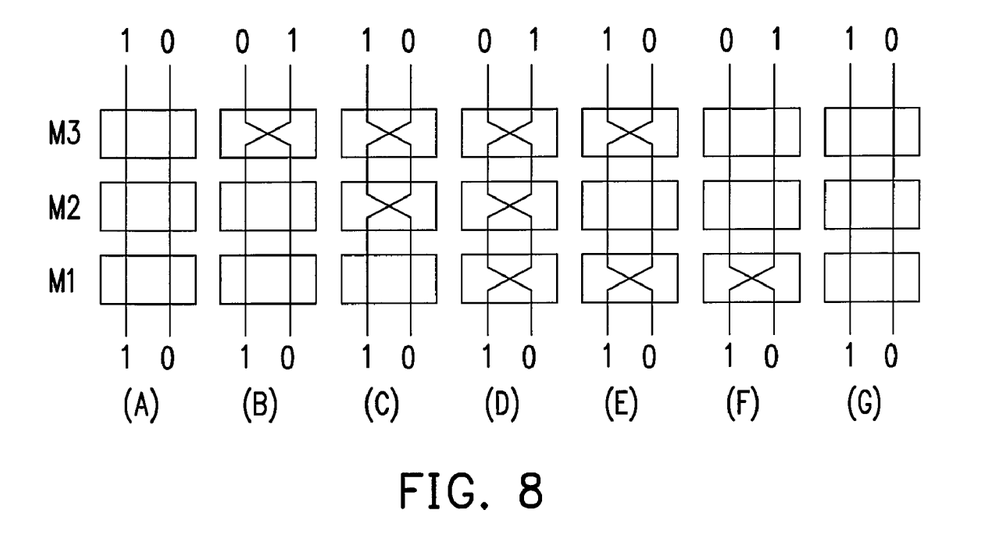
FIG. 8 is a simplified logic diagram of the switching operation of the signal switching apparatuses in three metal layers of the integrated circuit according to an embodiment of the present invention.

The operation of the signal switching apparatus of the present invention will be illustrated in detail with reference to the specific embodiment. FIG. 8 is a simplified logic diagram of the switching operation of the signal switching apparatuses in three conductive layers (e.g. the metal layers) of the integrated circuit according to an embodiment of the present invention. As shown in FIG. 8, each of the three metal layers M1, M2, and M3 has a signal switching apparatus, so as to form a three-level signal switching apparatus. Herein, the logic high level is "1", and the logic low level is "0". Provided that FIG. 8(A) is an initial state, the input is "1" and "0", and the output is "1" and "0". If there is a need to change the metal layer M3, the connection state of the signal switching apparatus in the metal layer M3 can be changed to switch the output logic to be 0 or 1, i.e., the state in FIG. 8(B). If there is a need to change the metal layer M2, in this embodiment, only the connection state of the signal switching apparatus in the metal layer M2 needs to be changed to switch the output logic to be 1 or 0, i.e., the state in FIG. 8(C). Thereafter, if there is a need to change the metal layer M1, only the connection state of the signal switching apparatus in the metal layer M1 needs to be changed correspondingly to make the output logic to be "0" and "1", i.e., the state in FIG. 8(D). After that, if there is a need to change the metal layer M2 again, only the signal switching apparatus in the metal layer M2 needs to be switched again to make the output logic to be 1 or 0, i.e., the state shown in FIG. 8(E). If there is a need to change the metal layer M3 again, only the signal switching apparatus in the metal layer M3 needs to be switched again to make the output logic to be 0 or 1, i.e., the state in FIG. 8(F). Then, if it is necessary to change the metal layer M1 again, only the signal switching apparatus needs to be switched again to make the output logic to be 1 or 0, i.e., the state in FIG. 8(G). Accordingly, the variation of the output logic signal can be achieved by individually changing the signal switching apparatus in each metal layer, and the number of times of changing of each signal switching apparatus is infinite in theory.

Figure 9:
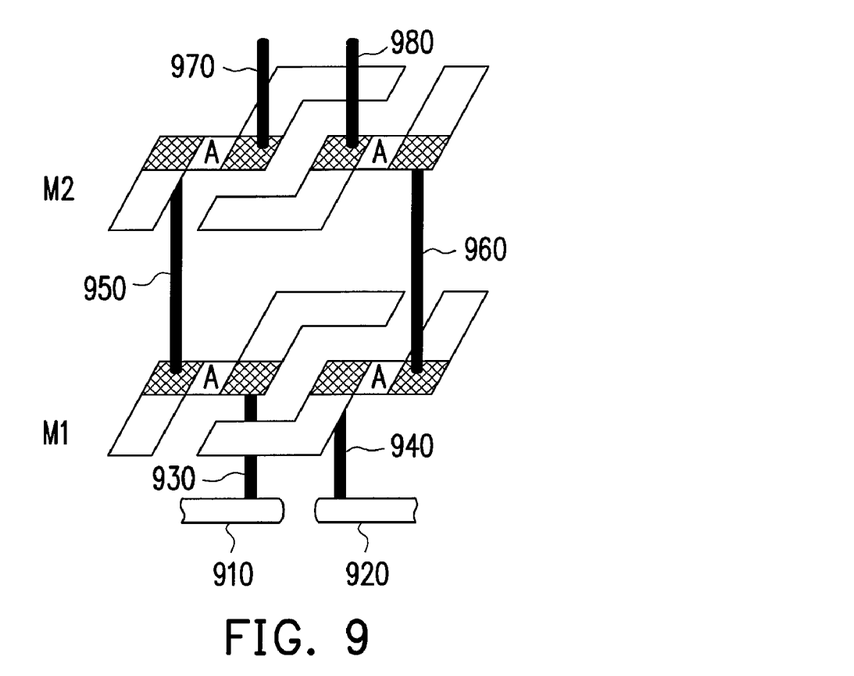
FIGS. 9 and 10 are layout views of the metal layer implementing the signal switching apparatus in the integrated circuit according to an embodiment of the present invention.
Figure 10:
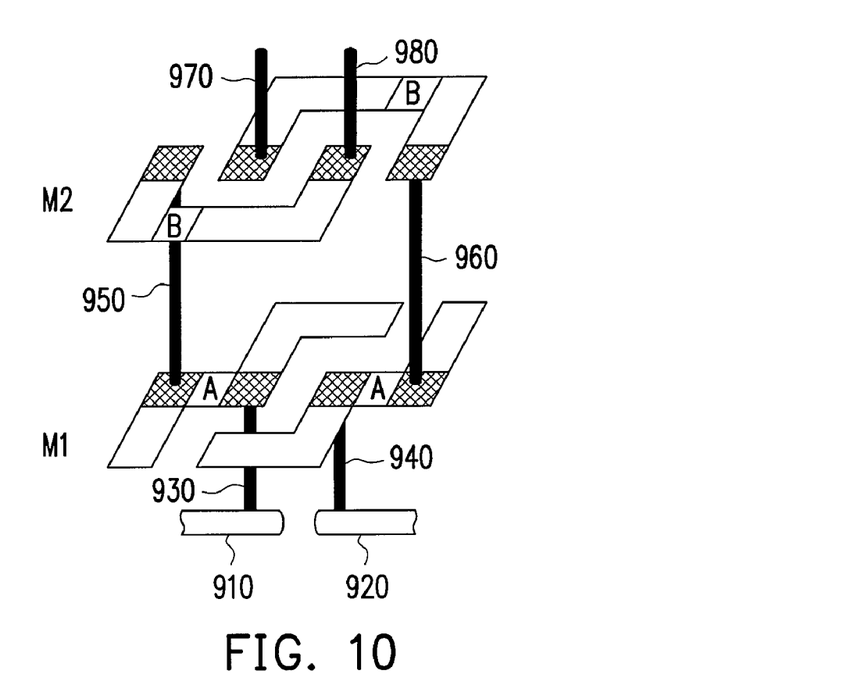

The signal generating device of the present invention will be illustrated with reference to the specific embodiment of the present invention. FIGS. 9 and 10 are layout views of the signal generating device implemented in the metal layers M1 and M2 in the integrated circuit according to an embodiment of the present invention. As shown in FIG. 9, M1 and M2 represent a first metal layer and a second metal layer in the integrated circuit respectively. The signal switching apparatus in the metal layer M1 and the signal switching apparatus in the metal layer M2 respective include four metal contacts indicated by grids in the figures. A polysilicon wire 910 is connected to the logic high level, and the polysilicon wire 920 is connected to the logic low level. The polisilicon wires 910 and 920 are electrically connected to two metal contacts in the metal layer M1 through the contact plug 930 and the contact plug 940 respectively. Another two metal contacts in the metal layer M1 are electrically connected to the two metal contacts in the metal layer M2 through the via plug 950 and the via plug 960 respectively. Another two metal contacts in the metal layer M2 are electrically connected to the metal contacts in the above metal layer M3 (not shown) through the via plug 970 and the via plug 980. The metal layers M1 and M2 are respectively patterned within different masks, such that metal interconnects can be formed at each Position A. Through the metal interconnects at each Position A, the logic high level of the polysilicon wire 910 reaches the via plug 950 through the contact plug 930 and the metal layer M1 and is output from the via plug 970 through the metal layer M2. Meanwhile, the logic low level of the polysilicon wire 920 reaches the via plug 960 through the contact plug 940 and the metal layer M1 and is output from the via plug 980 through the metal layer M2.

If there is a need to change the layout design of the metal layer M2, the signal generating device can be changed with reference to FIG. 10. As shown in FIG. 10, the polysilicon wire 910 is connected to the logic high level, and the polysilicon wire 920 is connected to the high low level. The polysilicon wires 910 and 920 are electrically connected to the two metal contacts in the metal layer M1 through the contact plug 930 and the contact plug 940 respectively. Another two metal contacts in the metal layer M1 are electrically connected to the two metal contacts in the metal layer M2 through the via plug 950 and the via plug 960 respectively. Another two metal contacts in the metal layer M2 are electrically connected to the metal contacts in the above metal layer through the via plug 970 and the via plug 980, respectively. If there is a need to change the metal layer M2, the metal layer M2 is patterned with the mask of the metal layer M2, and the metal interconnects at Positions A in the metal layer M2 in FIG. 9 are removed, and metal interconnects are formed at Positions B in the metal layer M2, as shown in FIG. 10. With the metal interconnects at Positions A in the metal layer M1 and the metal interconnects at Positions B in the metal layer M2, the logic high level of the polysilicon wire 910 is output from the via plug 980 through the contact plug 930, the metal layer M1, the via plug 950, and the metal layer M2. Meanwhile, the logic low level of the polysilicon wire 920 is output from the via plug 970 through the contact plug 940, the metal layer M1, the via plug layer 960, and the metal layer M2. Accordingly, the metal interconnects at Positions A and Positions B in each metal layer in FIG. 9 and FIG. 10 can function as the switch in the signal switching apparatus 200 shown in FIG. 2. The metal interconnects at Positions A or Positions B in the metal layer M2 can be disconnected or connected through changing the mask of the metal layer, thereby achieving the purpose of changing the output logic signal by using the signal switching apparatus 200. Definitely, the metal layer M1 or any conductive layer in the integrated circuit can be changed by using the same method.

Figure 11:
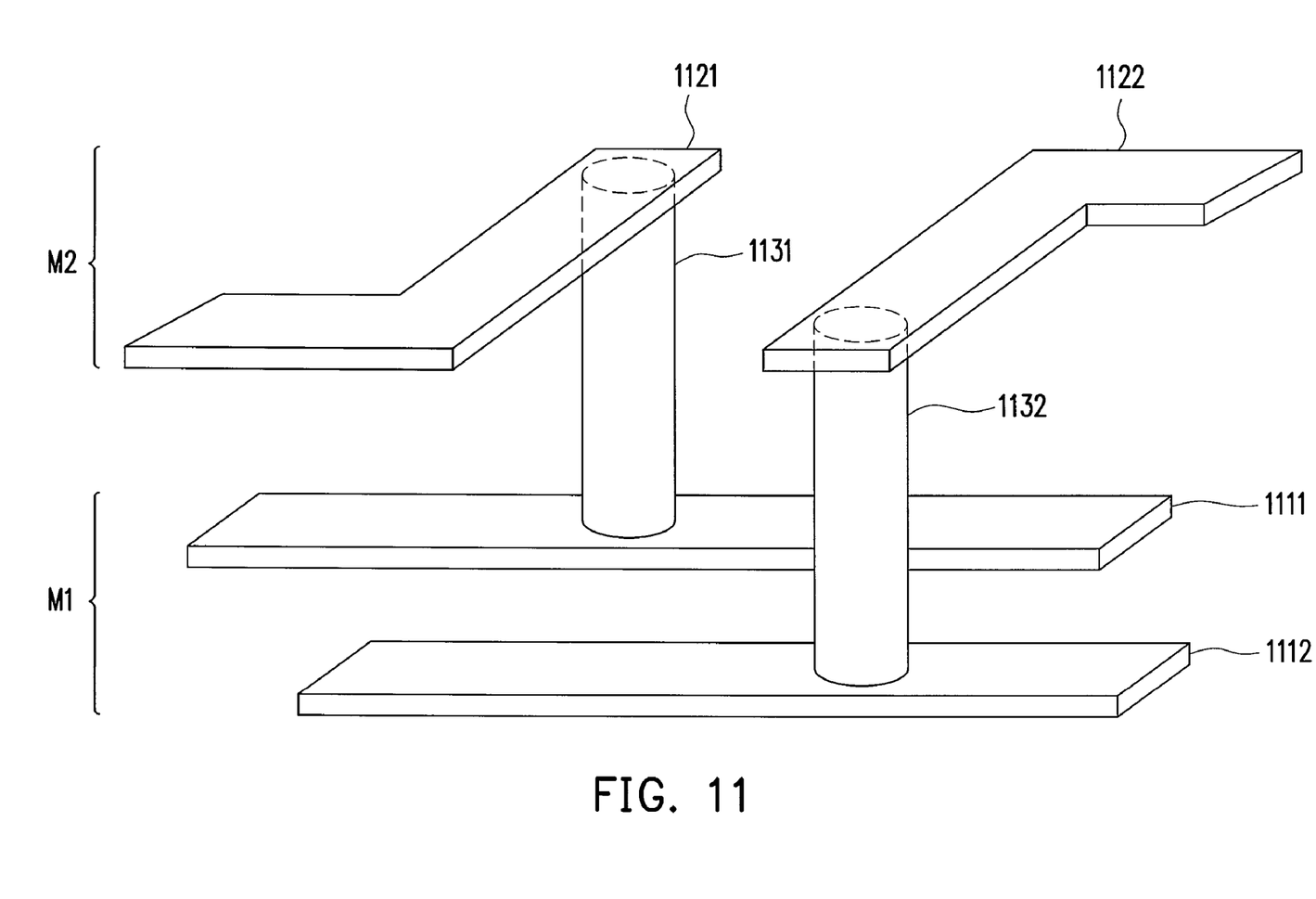
FIGS. 11 and 12 are layout views of the signal switching apparatus in the integrated circuit implemented by a via plug layer according to an embodiment of the present invention.
Figure 12:
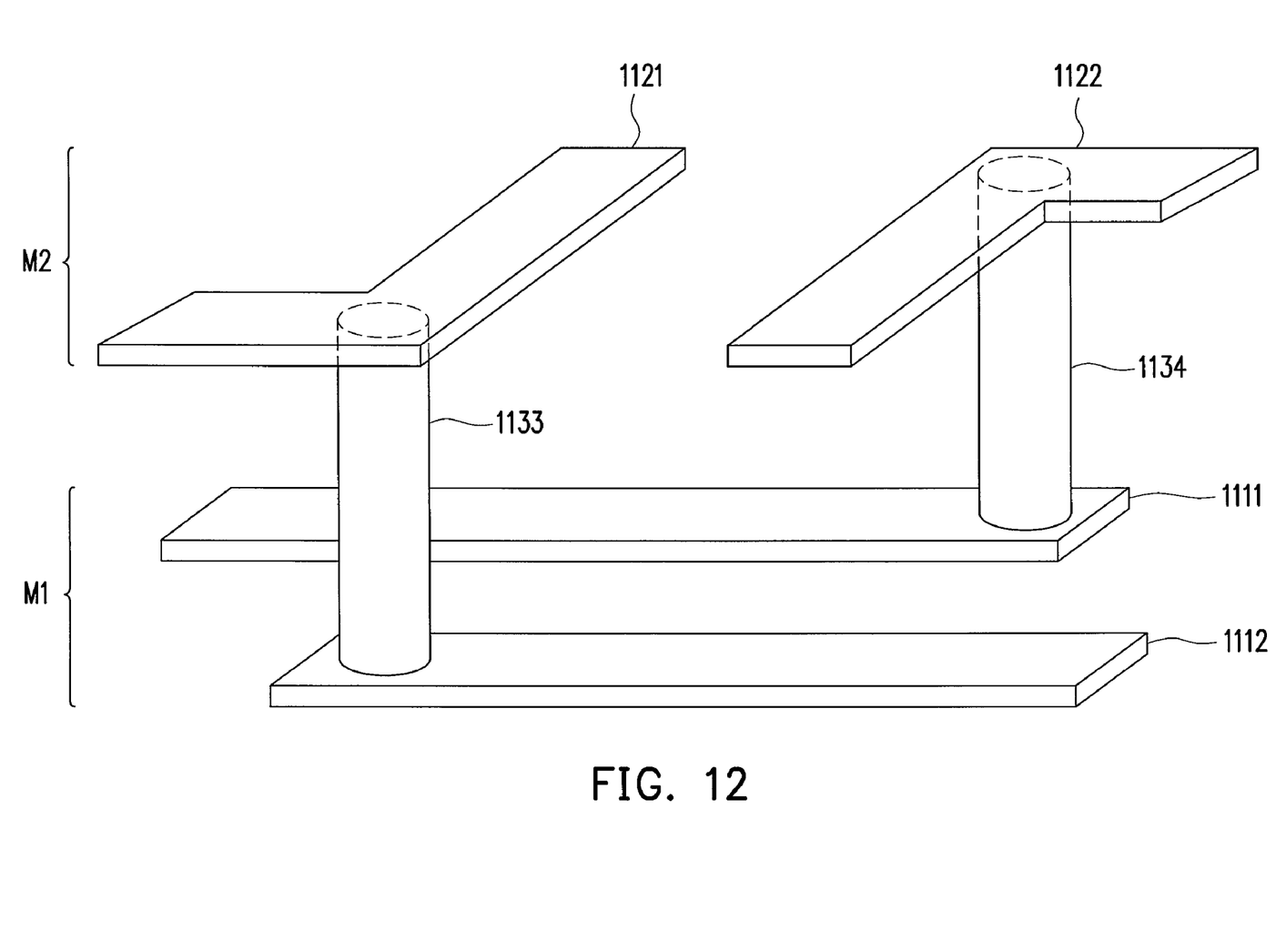

The signal switching apparatus in the integrated circuit is not limited to be applied to a metal layer. According to the spirit of the present invention, the signal switching apparatus can be implemented in any conductive layer in the integrated circuit. FIGS. 11 and 12 are layout views of the signal switching apparatus in the integrated circuit implemented by a via plug layer according to an embodiment of the present invention. As shown in FIG. 11, M1 and M2 represent the first metal layer and the second metal layer in the integrated circuit respectively. Here, it is assumed that the metal wire 1111 of the metal layer M1 is a logic high level, and the metal wire 1112 of the metal layer M1 is a logic low level. The metal wire 1111 is electrically connected to the metal wire 1121 in the metal layer M2 through the via plug 1131. The metal wire 1112 is electrically connected to the metal wire 1122 in the metal layer M2 through the via plug 1132. The via plug layer is patterned with the mask, such that the logic high level of the metal wire 1111 in the metal layer M1 reaches the metal wire 1121 in the metal layer M2 through the via plug 1131. Meanwhile, the logic low level of the metal wire 1112 in the metal layer M1 reaches the metal wire 1122 in the metal layer M2 through the via plug 1132.

If there is a need to change the output logic of the signal switching apparatus in the integrated circuit, the signal generating apparatus can be changed with reference to FIG. 12. As shown in FIG. 12, the via plug layer is patterned with the mask, so as to remove the via plug 1131 and the via plug 1132. Meanwhile, the via plug 1133 and the via plug 1134 can be disposed. The logic high level of the metal wire 1111 in the metal layer M1 reaches the metal wire 1122 in the metal layer M2 through the via plug 1134. Meanwhile, the logic low level of the metal wire 1112 in the metal layer M1 reaches the metal wire 1121 in the metal layer M2 through the via plug 1133. Accordingly, each via plug in FIG. 11 and FIG. 12 can function as the switch in the signal switching apparatus 200 as shown in FIG. 2. The output logic of the signal switching apparatus in the integrated circuit can be changed through changing the mask of the via plug layer, thereby realizing the signal switching apparatus 200 of the present invention. Definitely, any conductive layer in the integrated circuit can be changed by using the same method.

In view of the above, the present invention also provides a signal switching method to switch the passing signal many times. The method comprises: providing two transmission paths for a first input signal and a second input signal respectively; and in the transmission path of the first input signal and the transmission path of the second input signal, changing the transmission paths of the first input signal and the second input signal by plural groups of means, thereby changing the final output signal. Each group of the plural-group means can be used to change the transmission paths of the first input signal and the second input signal infinitely, thereby changing the final output signal.

In view of the above, in the signal generating and switching apparatus of the present invention, a simple layout technique is employed to form a signal switching apparatus in each of the metal layers in the integrated circuit. When there is a need to correct any one of the metal layers in the integrated circuit, the changing of the signal switching apparatus in the metal layer can be achieved by changing the pattern of the mask of the metal layer, thereby achieving the purpose of changing the output logic signal. Therefore, there is no need to change the top metal layer, thereby significantly reducing the cost of correcting the integrated circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal generating apparatus, comprising:
a first logic generating device, for outputting a signal of a first logic value;
a second logic generating device, for outputting a signal of a second logic value; and
a first signal switching apparatus within an integrated circuit, the first signal switching apparatus comprising a first input end, a second input end, a first output end, a second output end, a first switch, a second switch, a third switch, and a fourth switch, wherein the first input end and the second input end of the first signal switching apparatus are coupled to the first logic generating device and the second logic generating device respectively, the signal of the first logic value is transmitted from the first input end to the first output end of the first signal switching apparatus when the first switch is turned on, the signal of the first logic value is transmitted from the first input end to the second output end of the first signal switching apparatus when the third switch is turned on, the signal of the second logic value is transmitted from the second input end to the second output end of the first signal switching apparatus when the second switch is turned on, the signal of the second logic value is transmitted from the second input end to the first output end of the first signal switching apparatus when the fourth switch is turned on, and the first switch, the second switch, the third switch, and the fourth switch are turned on or turned off by patterning a conductive layer of the first signal switching apparatus with a corresponding mask within the integrated circuit, such that signals input from the first input end and the second input end of the first signal switching apparatus are output from the first output end and the second output end of the first signal switching apparatus respectively, or signals input from the first input end and the second input end of the first signal switching apparatus are output from the second output end and the first output end of the first signal switching apparatus respectively.

2. The signal generating apparatus as claimed in claim 1, further comprising:
a second signal switching apparatus, comprising a first input end, a second input end, a first output end, a second output end, a first switch, a second switch, a third switch, and a fourth switch, wherein the first input end and the second input end of the second signal switching apparatus are coupled to the first output end and the second output end of the first signal switching device respectively, the signal input from the first input end of the second signal switching apparatus is transmitted from the first input end to the first output end of the second signal switching apparatus when the first switch is turned on, the signal input from the first input end of the second signal switching apparatus is transmitted from the first input end to the second output end of the second signal switching apparatus when the third switch is turned on, the signal input from the second input end of the second signal switching apparatus is transmitted from the second input end to the second output end of the second signal switching apparatus when the second switch is turned on, and the signal input from the second input end of the second signal switching apparatus is transmitted from the second input end of the second signal switching apparatus to the first output end of the second signal switching apparatus when the fourth switch is turned on, such that signals input from the first input end and the second input end of the second signal switching apparatus are output from the first output end and the second output end of the second signal switching apparatus respectively, or signals input from the first input end and the second input end of the second signal switching apparatus are output from the second output end and the first output end of the second signal switching apparatus respectively.

3. The signal generating apparatus as claimed in claim 1, further comprising:
a plurality of second signal switching apparatuses coupled in series to form a multilevel signal switching apparatus, wherein the multilevel signal switching apparatus comprises a first input end, a second input end, a first output end, and a second output end, and the first input end and the second input end of the multilevel signal switching apparatus are coupled to the first output end and the second output end of the first signal switching apparatus, and the multilevel signal switching apparatus, by selectively turning on some switches of the multilevel signal switching apparatus and turning off remaining switches of the multilevel signal switching apparatus, provides a plurality of signal switching paths to transmit the signal input to the first input end of the multilevel signal switching apparatus to the first output end of the multilevel signal switching apparatus, transmit the signal input to the first input end of the multilevel signal switching apparatus to the second output end of the multilevel signal switching apparatus, transmit the signal input to the second input end of the multilevel signal switching apparatus to the first output end of the multilevel signal switching apparatus, and transmit the signal input to the second input end of the multilevel signal switching apparatus to the second output end of the multilevel signal switching apparatus, such that signals input from the first input end and the second input end of the multilevel signal switching apparatus are output from the first output end and the second output end of the multilevel signal switching apparatus respectively, or signals input from the first input end and the second input end of the multilevel signal switching apparatus are output from the second output end and the first output end of the multilevel signal switching apparatus respectively.

4. The signal generating apparatus as claimed in claim 3, wherein the first signal switching apparatus and the second signal switching apparatus are disposed in a corresponding conductive layer in the integrated circuit.

5. The signal generating apparatus as claimed in claim 1, wherein the first signal switching apparatus comprises:
a first switch coupled between the first input end and the first output end of the first signal switching apparatus, wherein when the first switch is turned on by placing a conductive material between a first set of two ends and electrically connecting the first set of two ends within the first switch, the signal of the first logic value input from the first input end of the first signal switching apparatus is output from the first output end;
a second switch coupled between the second input end and the second output end of the first signal switching apparatus, wherein when the second switch is turned on by placing a conductive material between a second set of two ends and electrically connecting the second set of two ends within the first switch, the signal of the second logic value input from the second input end of the first signal switching apparatus is output from the second output end;
a third switch coupled between the first input end and the second output end of the first signal switching apparatus, wherein when the third switch is turned on by placing a conductive material between a third set of two ends and electrically connecting the third set of two ends within the first switch, the signal of the first logic value input from the first input end of the first signal switching apparatus is output from the second output end; and
a fourth switch coupled between the second input end and the first output end of the first signal switching apparatus, wherein when the fourth switch is turned on by placing a conductive material between a fourth set of two ends and electrically connecting the fourth set of two ends within the first switch, the signal of the second logic value input from the second input end of the first signal switching apparatus is output from the first output end.

6. The signal generating apparatus as claimed in claim 5, wherein either the first switch and the second switch are simultaneously turned on or off; the third switch and the fourth switch are simultaneously turned on or off; and when the first switch and the second switch are turned on, the third switch and the fourth switch are turned off, and when the first switch and the second switch are turned off, the third switch and the fourth switch are turned on.

7. The signal generating apparatus as claimed in claim 1, wherein the first logic generating device is used to generate the signal of the first logic value as a logic high level, and the second logic generating device is used to generate the signal of the second logic value as a logic low level.

8. The signal generating apparatus as claimed in claim 7, wherein the first logic generating apparatus comprises:
a N-type transistor having a gate coupled to a drain, and a source connected to ground; and
a P-type transistor having a gate coupled to the drain of the N-type transistor, a source receiving a logic high level voltage, and a drain outputting the signal of the first logic value.

9. The signal generating apparatus as claimed in claim 1, wherein the second logic generating apparatus comprises:
a P-type transistor having a gate coupled to a drain, and a source receiving a logic high level voltage; and
a N-type transistor having a gate coupled to the drain of the P-type transistor, a source connected to ground, and a drain outputting the signal of the second logic value.

10. A signal switching apparatus for switching a passing signal many times and having a first input end, a second input end, a first output end, and a second output end, the signal switching apparatus comprising:

a first switch coupled in a conductive layer within an integrated circuit between the first input end and the first output end of the signal switching apparatus, wherein when the first switch is turned on by placing a conductive material between a first set of two ends of the first switch and electrically connecting the first set of two ends, a first signal input from the first input end of the signal switching apparatus is transmitted via the first switch from the first input end to the first output end of the signal switching apparatus and then output from the first output end;

a second switch coupled in the conductive layer within the integrated circuit between the second input end and the second output end of the signal switching apparatus, wherein when the second switch is turned on by placing a conductive material between a second set of two ends of the second switch and electrically connecting the second set of two ends, a second signal input from the second input end of the signal switching apparatus is transmitted via the second switch from the second input end to the second output end of the signal switching apparatus and then output from the second output end;

a third switch coupled in a conductive layer within an integrated circuit between the first input end and the second output end of the signal switching apparatus, wherein the third switch is turned on by placing a conductive material between a third set of two ends of the third switch and electrically connecting the third set of two ends, a first signal input from the first input end of the signal switching apparatus is transmitted via the third switch from the first input end to the second output end of the signal switching apparatus and then output from the second output end;

a fourth switch coupled in a conductive layer within an integrated circuit between the second input end and the first output end of the signal switching apparatus, wherein when the fourth switch is turned on by placing a conductive material between a fourth set of two ends of the fourth switch and electrically connecting the fourth set of two ends, a second signal input from the second input end of the signal switching apparatus is transmitted via the fourth switch from the second input end to the first output end of the signal switching apparatus and then output from the first output end; and wherein the first switch, the second switch, the third switch, and the fourth switch are turned on or turned off by patterning a conductive layer of the first signal switching apparatus with a corresponding mask within the integrated circuit.

11. The signal switching apparatus as claimed in claim 10, wherein either the first switch and the second switch are simultaneously turned on or off the third switch and the fourth switch are simultaneously turned on or off when the first switch and the second switch are turned on, the third switch and the fourth switch are turned off; and when the first switch and the second switch are turned off, the third switch and the fourth switch are turned on; thus realizing one of the following two circumstances: the first signal input from the first input end of the signal switching apparatus is output from the first output end, and the second signal input from the second input end of the signal switching apparatus is output from the second output end; and the first signal input from the first input end of the signal switching apparatus is output from the second output end, and the second signal input from the second input end of the signal switching apparatus is output from the first output end.

12. The signal switching apparatus as claimed in claim 11, wherein switching between the two circumstances is infinite.

13. The signal switching apparatus as claimed in claim 10, wherein a plurality of signal switching apparatuses is coupled in series to form a multilevel signal switching apparatus, and an output of the multilevel signal switching apparatus is changed by each of the signal switching apparatuses through controlling the on/off state of the switches of each of the signal switching apparatuses in the multilevel signal apparatus.

14. The signal switching apparatus as claimed in claim 10, wherein the first input end of the signal switching apparatus is coupled to a first logic generating device, the second input end of the signal switching apparatus is coupled to a second logic generating device, the first logic generating device is used to generate a logic high level, and the second logic generating device is used to generate a logic low level.

15. A signal switching method for switching a passing signal for a plurality of times within an integrated circuit having a first input end, a second input end, a first output end, and a second output end, wherein the first input end of the signal switching apparatus is coupled to a first logic generating device generating a logic high level and the second input end of the signal switching apparatus is coupled to a second logic generating device generating a logic low level, the signal switching method comprising:

placing a conductive material between a first set of two ends of a first switch and electrically connecting a first set of two ends to turn on the first switch such that a first signal input from the first input end of a signal switching apparatus is transmitted via the first switch from the first input end to the first output end of the signal switching apparatus and then output from the first output end, wherein the first switch is coupled in a conductive layer within the integrated circuit between the first input end and the first output end of the signal switching apparatus;

placing a conductive material between a second set of two ends of a second switch and electrically connecting the second set of two ends to turn on the second switch such that a second signal input from the second input end of the signal switching apparatus is transmitted via the second switch from the second input end to the second output end of the signal switching apparatus and then output from the second output end, wherein the second switch is coupled in the conductive layer within the integrated circuit between the second input end and the second output end of the signal switching apparatus;

placing a conductive material between a third set of two ends of a third switch and electrically connecting the third set of two ends to turn on the third switch such that a first signal input from the first input end of the signal switching apparatus is transmitted via the third switch from the first input end to the second output end of the signal switching apparatus and then output from the second output end, wherein the third switch is coupled in the conductive layer within the integrated circuit between the first input end and the second output end of the signal switching apparatus;

placing a conductive material between a fourth set of two ends of a fourth switch and electrically connecting the fourth set of two ends to turn on the fourth switch such that a second signal input from the second input end of the signal switching apparatus is transmitted via the fourth switch from the second input end to the first output end of the signal switching apparatus and then output from the first output end, wherein a fourth switch is coupled in the conductive layer within the integrated circuit between the second input end and the first output end of the signal switching apparatus; and wherein the first switch, the second switch, the third switch, and the fourth switch are turned on or turned off by patterning the conductive layer with a corresponding mask within the integrated circuit.

16. The signal switching method as claimed in claim 15, wherein either the first switch and the second switch are simultaneously turned on or off or the third switch and the fourth switch are simultaneously turned on or off, wherein, when the first switch and the second switch are turned on, the third switch and the fourth switch are turned off, and when the first switch and the second switch are turned off, the third switch and the fourth switch are turned on such that one of the following two circumstances is realized:

the first signal input from the first input end of the signal switching apparatus is output from the first output end, and the second signal input from the second input end of the signal switching apparatus is output from the second output end; and the first signal input from the first input end of the signal switching apparatus is output from the second output end, and the second signal input from the second input end of the signal switching apparatus is output from the first output end.

17. The signal switching method as claimed in claim 16, wherein switching between the two circumstances is infinite.

18. The signal switching method as claimed in claim 15, the signal switching method further comprising:

controlling the on/off state of the switches of each of a plurality of signal switching apparatuses in a multilevel signal apparatus to change an output of a multilevel signal switching apparatus, wherein a plurality of signal switching apparatuses is coupled in series to form the multilevel signal switching apparatus.

* * * * *